United States Patent
Huo et al.

(10) Patent No.: US 8,304,821 B2
(45) Date of Patent: Nov. 6, 2012

(54) CMOS IMAGE SENSOR

(75) Inventors: Jie Guang Huo, Shanghai (CN); Jianping Yang, Shanghai (CN); Chun Yan Xin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 347 days.

(21) Appl. No.: 11/615,969

(22) Filed: Dec. 23, 2006

(65) Prior Publication Data

US 2007/0181922 A1    Aug. 9, 2007

(51) Int. Cl.
*H01L 31/062* (2006.01)

(52) U.S. Cl. . 257/292; 257/290; 257/291; 257/E31.001; 438/48; 438/57

(58) Field of Classification Search ............ 257/290, 257/291, 292, 293
See application file for complete search history.

(56) References Cited

U.S. PATENT DOCUMENTS

| | | | |
|---|---|---|---|
| 5,854,100 A | 12/1998 | Chi | |
| 5,903,021 A | 5/1999 | Lee et al. | |
| 6,177,293 B1 * | 1/2001 | Netzer et al. | 438/73 |
| 6,194,258 B1 | 2/2001 | Wuu | |
| 6,534,356 B1 | 3/2003 | Yang et al. | |
| 6,654,057 B1 | 11/2003 | Rhodes | |
| 6,894,268 B2 * | 5/2005 | Ohkawa | 250/214.1 |
| 2005/0012124 A1 * | 1/2005 | Rhodes | 257/291 |
| 2005/0072994 A1 * | 4/2005 | Jeon | 257/291 |
| 2005/0269605 A1 * | 12/2005 | Yaung | 257/291 |
| 2006/0043436 A1 * | 3/2006 | Fan et al. | 257/291 |

* cited by examiner

*Primary Examiner* — Wael Fahmy
*Assistant Examiner* — Eva Yan Montalvo
(74) *Attorney, Agent, or Firm* — Kilpatrick Townsend & Stockton LLP

(57) ABSTRACT

A complementary metal oxide semiconductor (CMOS) image sensing device includes a semiconductor substrate; a photodiode defined on the substrate; a gate dielectric layer provided over the photodiode and the substrate; a polysilicon interconnect contacting a given area of the photodiode via an opening in the gate dielectric layer; a reset transistor coupled to the photodiode; a source follower transistor coupled to the photodiode; and a select transistor coupled to the source follower transistor. The given area of the photodiode defines a node that is coupled to the reset transistor and source follower transistor.

18 Claims, 2 Drawing Sheets

CMOS IMAGE SENSOR

BACKGROUND OF THE INVENTION

The present invention relates to a CMOS image sensor having a contact structure including polysilicon.

Two common types of semiconductor-based imagers are charge coupled devices (CCDs) and complementary metal oxide semiconductor (CMOS) devices. CCDs are often employed for image acquisition and enjoy a number of advantages which makes it the incumbent technology, particularly for small size imaging applications. CCDs are also capable of large formats with small pixel size and they employ low noise charge domain processing techniques. However, CCD imagers also suffer from a number of disadvantages. For example, they are susceptible to radiation damage, they exhibit destructive read out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there have been some attempts to integrate on-chip signal processing with the CCD array, these attempts have not been entirely successful. CCDs also transfer an image by line charge transfers from pixel to pixel, requiring that the entire array be read out into a memory before individual pixels or groups of pixels can be accessed and processed, which takes time. CCDs may also suffer from incomplete charge transfer from pixel to pixel during charge transfer which also results in image smear.

Because of the inherent limitations in CCD technology, CMOS image sensors have been gaining a wide acceptance for use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS image sensors over CCD imagers are that CMOS image sensors have a low voltage operation and low power consumption; CMOS image sensors are compatible with integrated on-chip electronics (control logic and timing, image processing, and signal conditioning such as A/D conversion); CMOS image sensors allow random access to the image data; and CMOS image sensors have lower fabrication costs as compared with the conventional CCD since standard CMOS processing techniques can be used. Additionally, low power consumption is achieved for CMOS image sensors because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS image sensor circuit includes a focal plane array of pixel cells, each one of the cells including either a photogate, photoconductor or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS image sensor, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS image sensor pixel is typically either a depleted p-n junction photodiode or a field induced depletion region beneath a photogate. For photodiodes, image lag can be eliminated by completely depleting the photodiode upon readout. More detailed description of the CMOS image sensor is provided in U.S. Pat. No. 6,654,057, which is incorporated by reference.

BRIEF SUMMARY OF THE INVENTION

Embodiments of the present invention relates to the interconnection of CMOS image sensors. The polysilicon interconnect is used to connect the photodiode to the conductive layer of the CMOS image sensor.

In one embodiment, a complementary metal oxide semiconductor (CMOS) image sensing device includes a semiconductor substrate; a photodiode defined on the substrate; a gate dielectric layer provided over the photodiode and the substrate; a polysilicon interconnect contacting a given area of the photodiode via an opening in the gate dielectric layer; a reset transistor coupled to the photodiode; a source follower transistor coupled to the photodiode; and a select transistor coupled to the source follower transistor. The given area of the photodiode defines a node that is coupled to the reset transistor and source follower transistor.

In another embodiment, a complementary metal oxide semiconductor (CMOS) image sensing device includes a semiconductor substrate; a photodiode defined on the substrate; a gate dielectric layer provided over the photodiode and the substrate; a polysilicon interconnect contacting a given area of the photodiode via an opening in the gate dielectric layer; a first transistor coupled to the photodiode; a second transistor coupled to the photodiode and the first transistor; and a third transistor coupled to the second transistor. The given area of the photodiode defines a node that is coupled to the first and second transistors.

DETAILED DESCRIPTION OF THE INVENTION

Figure 1:
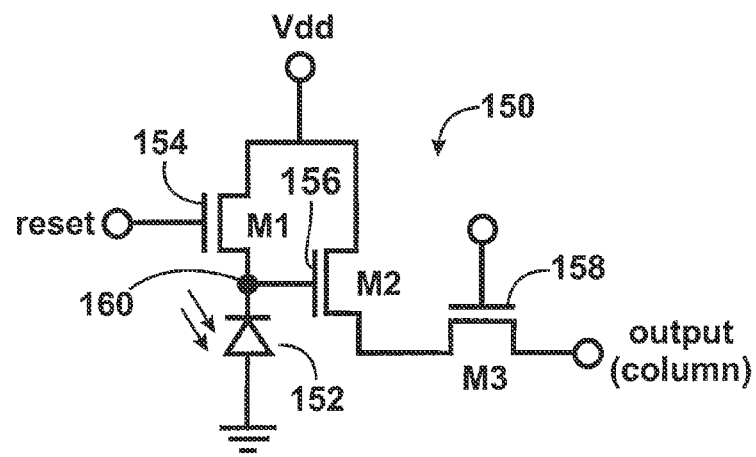
FIG. 1 illustrates a circuit of a pixel cell in a CMOS image sensor.

The present invention relates to CMOS image sensors with reduced junction leakage, e.g., dark current. FIG. 1 illustrates a circuit 150 of a pixel cell in a CMOS image sensor. The pixel cell is a three-transistor (3T) design. The circuit 150 includes a photodiode 152, a reset transistor 154, a source follower transistor 156, and a row select transistor 158. A node 160 couples the photodiode, reset transistor, and source follower transistor.

Figure 2:
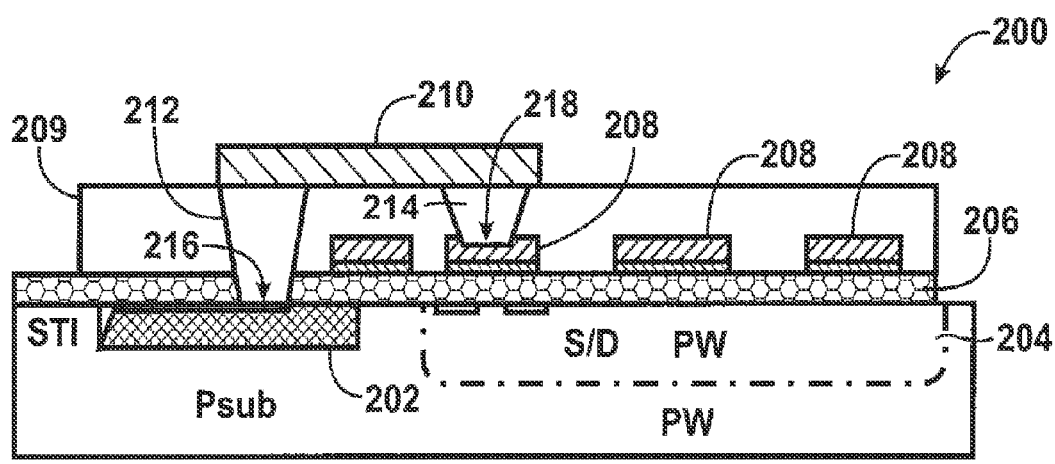
FIG. 2 illustrates a schematic cross-section of a 3T pixel cell.

FIG. 2 illustrates a schematic cross-section of a 3T pixel cell 200. A photodiode 202 is provided on a silicon substrate. A source/drain region 204 is provided at a given distance from the photodiode. A gate oxide layer 206 is provided over the photodiode 202 and the source/drain region 204. A plurality of gates 208 are formed over the gate oxide. These gates are the gates for the reset transistor, source follower transistor, and row select transistor. An inter-layer dielectric (ILD) 209 is formed over the gates 208. A metal layer 210 is formed over the ILD 209. A first metal interconnect 212 connects the metal layer 210 and the photodiode 202. A second metal interconnect 214 connects the metal layer 210 and one of the gates 208. A first contact area 216 provided between the first metal interconnect 212 and the photodiode 202 corresponds to the node 160 in FIG. 1. A second contact area 218 is provided between the second metal interconnect 214 and one of the gates 208, e.g., the gate of a source follower transistor.

Figure 3:
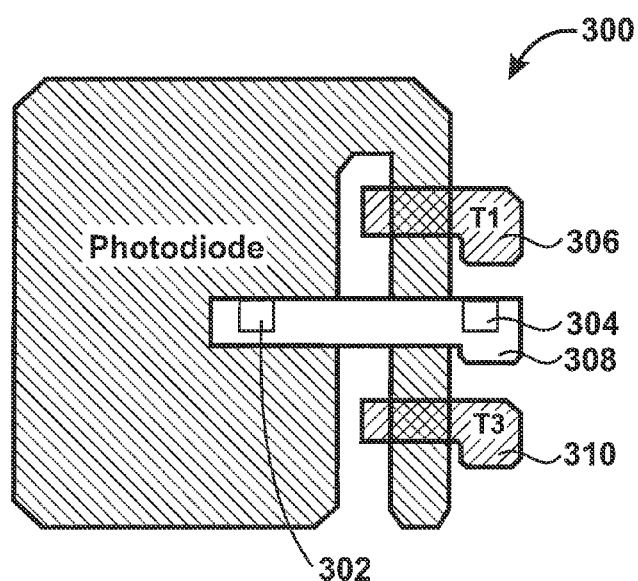
FIG. 3 illustrates a top view of a 3T pixel cell.

FIG. 3 illustrates a top view of a 3T pixel cell 300. A node 302 corresponds to the area 216. A node 304 corresponds to the area 218. A first transistor 306 corresponds to the reset transistor 154. A second transistor 308 corresponds to the source follower transistor 156. A third transistor 310 corresponds to the select transistor 158.

One of the main issues associated with pixel photo sensing region is the dark current or dark leakage. The photodiode node leakage current generally results from a number of problematic regions. One of these regions is a node in the photodiode that connects the reset transistor and the source follower transistor, i.e., the node 160, 216. Another such a region is the node 218 (see FIG. 2). In a conventional three-transistor (3T) CMOS image sensor pixel process design, such as one illustrated in FIG. 3, the electrical connection between the photodiode 300 and the gate of the source follower 308 is established by a metal interconnect. The via for the metal interconnect is formed by etching an inter-layer dielectric (ILD) using a reactive ion etch (RIE) technique. The photodiode region (or the node 302) is also etched during this step, which damages the crystal structure of the photodiode region. Such an etch damage also results on the node 304. These damages are a significant source of dark current in the CMOS image sensor.

Figure 4:
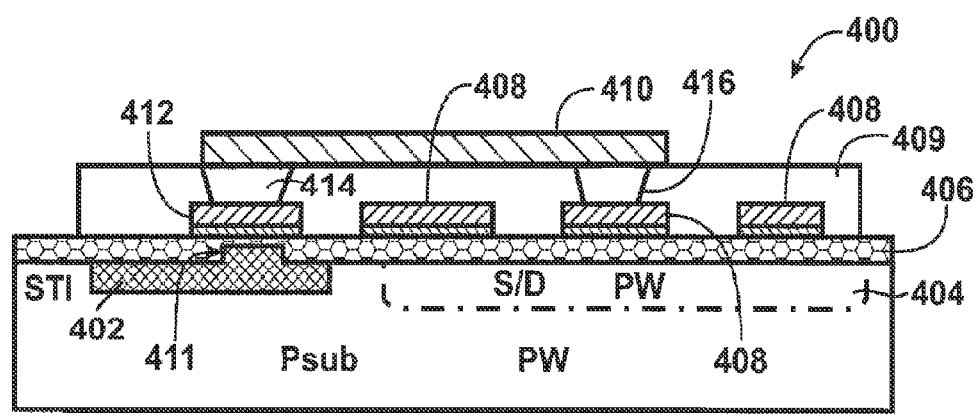
FIG. 4 illustrates a cross-sectional view of a 3T pixel cell of CMOS image sensor according to one embodiment of the present invention.

FIG. 4 illustrates a cross-sectional view of a 3T pixel cell 400 of CMOS image sensor according to one embodiment of the present invention. A photodiode 402 is provided on a silicon substrate. A source/drain region 404 is provided at a given distance from the photodiode. A gate oxide layer 406 is provided over the photodiode 402 and the source/drain region 404. A plurality of gates 408 are formed over the gate oxide. These gates are the gates for the reset transistor, source follower transistor, and row select transistor. An inter-layer dielectric (ILD) 409 is formed over the gates 408.

A conductive layer 410 is formed over the ILD 409. The conductive layer 410 may be polysilicon or metal. A first polysilicon interconnect 412 connects the polysilicon layer 410 and the photodiode 402. The first polysilicon interconnect is formed at the time the gates 408 are formed. An opening 411 (or window) is made on the gate oxide layer 406 prior to forming the gates 408 and the first polysilicon interconnect. The opening defines a contact area between the photodiode 402 and the first polysilicon interconnect 412. The opening may be made using a wet etch or dry etch method. In one embodiment, the opening is made using a wet etch method using HF. The wet etch minimizes the crystal damage, and thus the dark current. Dopants (e.g., n-type dopants) are implanted into the opening 411 to provide ohmic contact between the first polysilicon interconnect 412 and the photodiode. The above doping step may be carried out at the time the source/drain region 404 of the substrate is doped.

Even if the dry etch is used to open the gate oxide layer 406, the damage to the silicon crystal of the photodiode is minimal when compared to the conventional method of FIG. 2. The etch step of the present embodiment involves opening the gate oxide layer, whereas the RIE method of FIG. 2 involves forming a via through the ILD 409 that is much thicker than the gate oxide layer 406.

A second polysilicon interconnect 414 couples the first polysilicon interconnect 412 to the conductive layer 410. A third polysilicon interconnect 416 couples the gate 408 to the conductive layer 410. The conductive layer 410 is a polysilicon layer in the present embodiment, but may be a metal layer in another embodiment.

The present invention has been described in terms of specific embodiments. As will be understood by those skilled in the art, the embodiment disclosed above may be altered or modified without departing from the scope of the present invention. The scope of the invention should be interpreted using the appended claims.

What is claimed is:

1. A complementary metal oxide semiconductor (CMOS) image sensing device, comprising:
   a semiconductor substrate having a source/drain region;
   a photodiode having a surface area defined on the substrate and disposed at a given distance from the source/drain region;
   a gate dielectric layer covering the surface area of the photodiode and the source/drain region of the substrate;
   a polysilicon layer directly provided over the gate dielectric layer, the polysilicon layer comprising a polysilicon interconnect and a plurality of gates, the polysilicon interconnect contacting a given area of the photodiode less than the covered surface area of the photodiode via an opening in the gate dielectric layer, the given area being doped to provide an ohmic contact for the polysilicon interconnect;
   a second interconnect connecting the polysilicon interconnect to a conductive layer provided above the polysilicon interconnect;
   a reset transistor coupled to the photodiode;
   a source follower transistor coupled to the photodiode;
   a select transistor coupled to the source follower transistor; and
   a third interconnect connecting the conductive layer to a gate of the source follower transistor;
   wherein the given area of the photodiode defines a node that is coupled to the reset transistor and the source follower transistor.

2. The device of claim 1, wherein the node is coupled to the gate of the source follower transistor.

3. The device of claim 1, wherein the opening of the gate dielectric layer is formed by a wet etch method.

4. The device of claim 1, wherein the polysilicon interconnect is made at the same time as gates of the reset transistor, source follower transistor, and select transistor are formed.

5. The device of claim 1, wherein the second interconnect or the third interconnect comprises polysilicon.

6. A complementary metal oxide semiconductor (CMOS) image sensing device, comprising:
   a semiconductor substrate having a source/drain region;
   a photodiode having a surface area defined on the substrate and disposed at a distance from the source/drain region;
   a gate dielectric layer covering the surface area of the photodiode and the substrate;
   a polysilicon layer directly provided over the gate dielectric, the polysilicon layer comprising a polysilicon interconnect, the polysilicon interconnect contacting a given area of the photodiode less than the covered area of the photodiode via an opening in the gate dielectric layer, the given area being doped to provide an ohmic contact for the polysilicon interconnect;
   a second interconnect connecting the polysilicon interconnect to a conductive layer provided above the polysilicon interconnect;
   a first transistor coupled to the photodiode;
   a second transistor coupled to the photodiode and the first transistor;
   a third transistor coupled to the second transistor; and
   a third interconnect connecting the conductive layer to a gate of the second transistor;
   wherein the given area of the photodiode defines a node that is coupled to the first and second transistors.

7. The device of claim 6, wherein the first transistor is a reset transistor, the second transistor is a source follower transistor, and the third transistor is a select transistor.

8. The device of claim 6, wherein the node is coupled to the gate of the second transistor.

9. A method for forming a CMOS image sensing device, the method comprising:
   providing a substrate having a source/drain region;
   forming a photodiode having a surface area on the substrate, the photodiode being disposed at a distance from the source/drain region;
   providing a gate dielectric layer over the surface area of the photodiode and the source/drain region of the substrate;
   forming a first opening in the gate dielectric layer to expose a given area of the photodiode, the exposed given area being less than the surface area of the photodiode;
   forming a polysilicon layer over the gate dielectric, the polysilicon layer comprising a plurality of gates overlying the source/drain region and a first polysilicon interconnect contacting the exposed given area of the photodiode through the first opening in the gate dielectric layer;
   forming a reset transistor coupled to the photodiode;
   forming a source follower transistor coupled to the photodiode;
   forming a second polysilicon interconnect overlying the first polysilicon interconnect;
   forming a third polysilicon interconnect overlying a gate of the source follower transistor; and
   forming a conductive layer connecting the second polysilicon interconnect and the third polysilicon interconnect;
   wherein the first polysilicon interconnect is formed at the same time as the gate of the source follower transistor.

10. The method of claim 9, wherein the exposed surface area defines a node that is coupled to the reset transistor and the source follower transistor.

11. The method of claim 10, wherein the node is coupled to the gate of the source follower transistor.

12. The method of claim 9, wherein forming the opening comprises a wet etch method.

13. The method of claim 9, wherein the third polysilicon interconnect is formed at the same time as the second polysilicon interconnect.

14. The method of claim 9, wherein the conductive layer comprises polysilicon.

15. The method of claim 9, wherein the conductive layer comprises metal.

16. The method of claim 9, wherein the given area is doped at the same time as the source/drain region is doped.

17. The method of claim 9, wherein forming the first opening in the gate dielectric layer comprises a wet etch method.

18. The method of claim 9, wherein forming the third polysilicon interconnect comprise forming a second opening in the gate dielectric layer at the same time as forming the first opening.

* * * * *